(12) United States Patent
Abedifard et al.

(10) Patent No.: US 9,793,003 B2
(45) Date of Patent: Oct. 17, 2017

(54) PROGRAMMING OF NON-VOLATILE MEMORY SUBJECTED TO HIGH TEMPERATURE EXPOSURE

(71) Applicant: Avalanche Technology, Inc., Fremont, CA (US)

(72) Inventors: Ebrahim Abedifard, San Jose, CA (US); Uday Chandrasekhar, San Jose, CA (US); Rajiv Yadav Ranjan, San Jose, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/265,774

(22) Filed: Sep. 14, 2016

(65) Prior Publication Data

US 2017/0076818 A1   Mar. 16, 2017

Related U.S. Application Data

(60) Provisional application No. 62/219,096, filed on Sep. 15, 2015.

(51) Int. Cl.
| | |
|---|---|
| *G11C 17/00* | (2006.01) |
| *G11C 17/18* | (2006.01) |
| *G11C 17/16* | (2006.01) |
| *G11C 11/16* | (2006.01) |
| *G11C 7/20* | (2006.01) |
| *G11C 11/00* | (2006.01) |

(Continued)

(52) U.S. Cl.
CPC ............ *G11C 17/18* (2013.01); *G11C 7/04* (2013.01); *G11C 7/20* (2013.01); *G11C 11/005* (2013.01); *G11C 11/1673* (2013.01); *G11C 11/1675* (2013.01); *G11C 17/02* (2013.01); *G11C 17/16* (2013.01); *G11C 17/165* (2013.01); *G11C 29/52* (2013.01)

(58) Field of Classification Search
CPC .. G11C 11/1673; G11C 11/1675; G11C 17/16
USPC ....... 365/158, 46, 55, 74, 97, 100, 131, 148, 365/171, 173, 163, 96
See application file for complete search history.

(56) References Cited

U.S. PATENT DOCUMENTS

| | | | |
|---|---|---|---|
| 7,085,183 B2 | 8/2006 | Yang et al. | |
| 7,224,628 B2 | 5/2007 | Yang et al. | |

(Continued)

*Primary Examiner* — Fernando Hidalgo
(74) *Attorney, Agent, or Firm* — Maryam Imam; Bing K. Yen

(57) ABSTRACT

A memory device having features of the present invention comprises a reprogrammable memory portion including therein a first plurality of magnetic tunnel junctions (MTJs) whose resistance is switchable; and a one-time-programmable (OTP) memory portion including therein a second plurality of MTJs whose resistance is switchable and a third plurality of MTJs whose resistance is fixed. Each MTJ of the first, second, and third plurality of MTJs includes a magnetic free layer having a magnetization direction substantially perpendicular to a layer plane thereof and a magnetic reference layer having a fixed magnetization direction substantially perpendicular to a layer plane thereof. The second plurality of MTJs represents one of two logical states and the third plurality of MTJs represents the other one of the two logical states.

13 Claims, 12 Drawing Sheets

(51) Int. Cl.
   *G11C 17/02*   (2006.01)
   *G11C 7/04*    (2006.01)
   *G11C 29/52*   (2006.01)

(56) References Cited

U.S. PATENT DOCUMENTS

| | | |
|---|---|---|
| 7,321,519 B2 | 1/2008 | Yang et al. |
| 7,369,430 B2 | 5/2008 | Yang et al. |
| 2010/0220517 A1* | 9/2010 | Okayama ................. G11C 7/20 |
| | | 365/158 |

* cited by examiner

PROGRAMMING OF NON-VOLATILE MEMORY SUBJECTED TO HIGH TEMPERATURE EXPOSURE

CROSS REFERENCE TO RELATED APPLICATIONS

The present application claims the benefit of the provisional application bearing Ser. No. 62/219,096 filed on Sep. 15, 2015, entitled "In-System Programming of Non-Volatile Memory Tolerant of Exposure to High Temperatures."

BACKGROUND OF THE INVENTION

Field of the Invention

The present invention relates to a non-volatile memory, and more particularly to a magnetic random access memory (MRAM) and a method for programming the same memory subjected to high temperature exposure.

Description of the Prior Art

Certain types of non-volatile memory, such as magnetic random access memory (MRAM) and phase change magnetic random access memory (PCRAM), may lose saved data when exposed to high temperatures during manufacturing. Unlike flash memory, memory cells of MRAM and PCRAM with valid saved data may not retain the saved data when exposed to high temperatures that may cause unintended switching of the resistance state of the memory cells.

During manufacturing of MRAM with memory cells made of magnetic tunnel junctions (MTJs), test code, boot code, and the like are oftentimes written to the memory at the wafer level prior to dicing and packaging, which may expose the MTJ memory cells to temperatures of greater than 200° C. For example, upon completion of cutting and sorting of numerous dies of a wafer during manufacturing, each die is packaged. Packaging may expose the MTJ memory cells in a die to high temperatures. Similarly, soldering of an MRAM die to a circuit board would require heating the solder to cause reflow, thereby exposing the MTJ memory cells in the die to high temperatures. If certain data is written to the MTJ memory cells of the die before the solder reflow process, which may expose the MTJ memory cells to temperatures of 200° C. and above for periods of 2 minutes and longer, the written data may become corrupted as the MTJ memory cells randomly switch their resistance state after the reflow process.

FIG. 1 shows a graph 10 of resistance distributions of a population MTJs being built during manufacturing using current manufacturing techniques. It is first noted that the behavior of MTJs is similar to resistors; accordingly, resistance or resistance value as referred to herein, represents the resistance of MTJs.

In FIG. 1, the graph 10 shows resistance in the x-axis and the number of MTJs in the y-axis. Accordingly, two resistance distributions are shown by the graph 10, one being the resistance distribution 12 of the MTJs at a state represented by high resistance ($R_H$) and another being the resistance distribution 14 of the MTJs at a state represented by low resistance ($R_L$).

The gap shown between the inner edges of the resistance distributions 12 and 14 distinguishes one state from another during read and write operations. For example, the resistance range shown at 16 in graph 10 separates the $R_H$ from $R_L$ distributions. A resistance within the distribution curve 14 could be considered (or sensed) a "high" state, i.e. logical value "1". Similarly, a resistance within the distribution curve 12 could be considered or sensed as a low state, i.e. "0". It is noted that the state representations may be reversed.

The resistance state of an MTJ memory cell may randomly switch to an opposite state when exposed to high temperatures, such as those encountered during packaging or solder reflow process. This become a problem when manufacturers save data to MRAM before exposure to high temperatures.

Currently, there are no known solutions for the foregoing issue. It is noted that MRAM is not the only type of non-volatile memory suffering from the foregoing problem. Indeed, any non-volatile memory that is exposed to high temperatures for a relatively lengthy period of time may similarly suffer from the data corruption problem.

SUMMARY

The present invention is directed to a non-volatile memory and a method that allows the same memory to retain its data integrity after exposure to elevated temperatures. A memory device having features of the present invention comprises a reprogrammable memory portion including therein a first plurality of magnetic tunnel junctions (MTJs) whose resistance is switchable; and a one-time-programmable (OTP) memory portion including therein a second plurality of MTJs whose resistance is switchable and a third plurality of MTJs whose resistance is fixed. Each MTJ of the first, second, and third plurality of MTJs includes a magnetic free layer having a magnetization direction substantially perpendicular to a layer plane thereof and a magnetic reference layer having a fixed magnetization direction substantially perpendicular to a layer plane thereof. The second plurality of MTJs represents one of two logical states and the third plurality of MTJs represents the other one of the two logical states.

According to another aspect of the present invention, a method for using a non-volatile memory, which includes a plurality of memory cells, includes the steps of storing data in the plurality of memory cells by shorting a portion of the plurality of memory cells to represent a first logical state while leaving the other portion of the plurality of memory cells to represent a second logical state; and heating the plurality of memory cells to a temperature sufficiently high to cause at least one of the plurality of memory cells to change the resistance state thereof. The resistance state of each of the other portion of the plurality of memory cells is switchable between a low resistance level and a high resistance level. The method may further include the step of programming the other portion of the plurality of memory cells that represent the second logical state to the high resistance level after the step of heating. The data stored in the plurality of memory cells may be updated after the step of heating by saving the updated data in another plurality of memory cells in the non-volatile memory, the resistance state of each of the another plurality of memory cells is switchable between a low resistance level and a high resistance level.

IN THE DRAWINGS

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Methods of the invention not only retain the resistance states of a portion of a memory device with non-volatile memory cells. In accordance with a method of the invention, one or more non-volatile memory cells in a selected portion of the memory device is shorted by applying a breakdown voltage ($V_{BreakDown}$) thereto, the $V_{BreakDown}$ being a voltage required to permanently short the non-volatile memory cells of the memory device. The shorted memory cells in the selected portion of the memory device are in a low resistance state that represents one of two logical states ("0" or "1"), while other memory cells in the selected portion are in higher resistance states, which collectively represent the other one of two logical states.

Alternatively, upon reprogramming or updating of the non-volatile memory cells of the selected portion of the memory device, programming or updating is directed to a location of the memory device other than the location of the selected portion of non-volatile memory cells within the memory device.

FIGS. 2a-2d show various graphs of resistance distribution curves in accordance with embodiments and methods of the invention.

Figure 1:
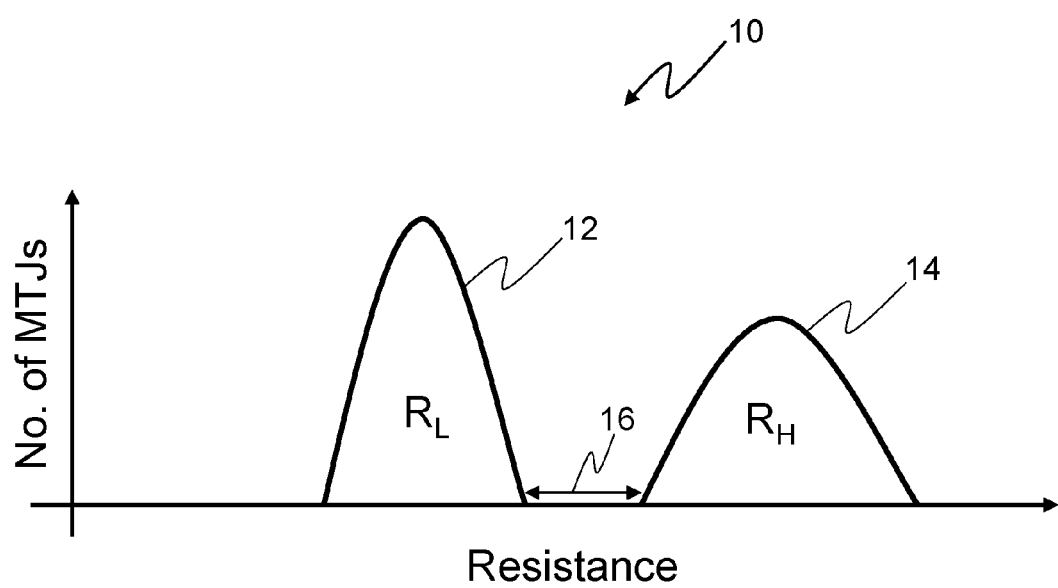
FIG. 1 shows a graph 10 of the resistance distributions of a population of MTJs being built during manufacturing using current manufacturing techniques.
Figure 2A:
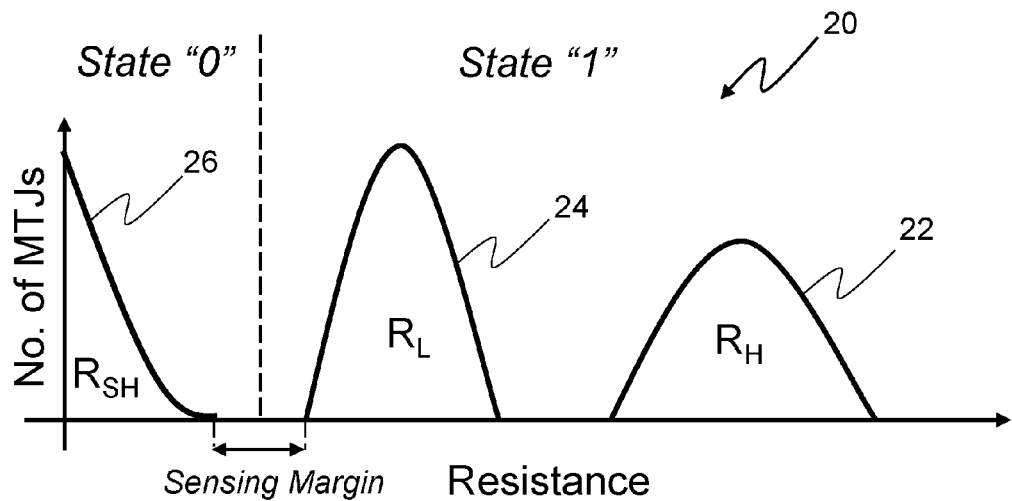
FIGS. 2a-2d show various graphs of resistance distribution curves in accordance with embodiments and methods of the present invention.

Referring now to FIG. 2a, a graph 20 of the resistance distributions of two populations of MTJs during manufacturing is shown, in accordance with methods and apparatus of the invention. Similar to graph 10 of prior art FIG. 1, the graph 20 shows an x-axis representing resistance and a y-axis representing the number of MTJs. In contrast to graph 10, graph 20 shows three resistance distribution curves 22-26. A first population of normal MTJs may switch between low and high resistance states. Resistance distribution curve 22 shows a range of high resistances ($R_H$) representing a high state, and resistance distribution curve 24 shows a range of low resistances ($R_L$) representing a low state. A second population of shorted MTJs have permanently shorted resistances. Resistance distribution curve 26 shows a range of the shorted resistances (RsH) that represent a possible third state. Typical resistance values of present day MTJs are approximately 7,500Ω for $R_H$, 3,000Ω for $R_L$ and 300-500Ω for $R_{SH}$.

It is however contemplated that MTJs discussed and shown herein merely serve as exemplary embodiments and methods of manufacturing thereof and that other memory types that are exposed to high temperatures during manufacturing, either prior to or after solder reflow, for relatively long time periods causing disturbance and that can have a permanent state which is not affected by high temperatures, are candidate memories to which the embodiments and methods of the invention apply. Examples of such memory include, without limitation, magnetic memory and resistive memory and any other suitable non-volatile memory as discussed above. A few examples of such memory with the caveat of having the capability of withstanding high temperatures by maintaining a permanent state, include resistive random access memory (ReRAM), phase change random access memory (PCRAM), ferro-electric random access memory (FeRAM), and magnetic random access memory (MRAM).

A typical MTJ memory element includes a magnetic reference layer and a magnetic free layer with a thin insulating tunnel junction layer interposed therebetween. In an embodiment of the present invention, the magnetic reference layer has a fixed magnetization direction that is substantially perpendicular to a layer plane thereof, and the magnetic free layer has a variable magnetization direction that is substantially perpendicular to a layer plane thereof. In another embodiment, the MRAM device is a spin-transfer torque (STT) MRAM, in which an MTJ is programmed by flowing a current directly through the MTJ itself to generate a spin transfer torque that switches the magnetization direction of the magnetic free layer, thereby changing the resistance of the MTJ. The shorting of the MTJ may be caused by the application of high voltages, i.e. voltages greater than the "breakdown voltage," to rupture the insulating tunnel junction layer. Upon shorting of the MTJ, the resistance of the MTJ becomes permanently fixed and this resistance is typically far lower than $R_L$, such as noted in the example provided above. In the various embodiments and methods of the invention, a third state of the MTJ is created upon shorting of the MTJ. It should be noted that for STT-MRAM, the rupture of the insulating tunnel junction layer in an MTJ not only fixes the resistance state thereof by causing shorting, but also fixes the magnetization direction of the magnetic free layer in the MTJ because a spin-transfer torque can no longer be generated to switch the magnetization direction of the free layer.

In some embodiments of the invention, the state of $R_{SH}$ is used to represent one of the two logical states ("0" or "1") with the other logical state represented either by $R_H$ or $R_L$. A discussion of graph 20 with reference to FIG. 2a serves to further clarify the foregoing. In graph 20, distribution curve 26 shows a range of MTJ resistances when the MTJs are shorted. To this end, the MTJs are no longer programmable but nevertheless may represent a specific state. The inventors, through extensive research and experimentation, have come up with a scheme that takes advantage of shorting of the MTJ as a third state to avoid cell disturbance and in some embodiments, even improve reliability.

It is appreciated that while three curves representing three resistances states are shown in FIG. 2a, not all three resistances states are required for in the present invention. One possible approach is to use the combination of curve 26 and curve 24, where curve 26 represents one of two logical states and curve 24 represents the other logical state. Another possible approach is to use the combination of curve 26 and curve 22, where curve 26 represents one of two logical states and curve 22 represents the other logical state. Still another possible approach is to use $R_{SH}$ to represent one of two logical states and either $R_L$ or $R_H$ to represent the other logical state. In the exemplary embodiment of FIG. 2a, curve 26 is shown to represent (logic) state "0" and either curve 24 or curve 22 is shown to represent the (logic) state "1". Alternatively, this state assignment may be reversed.

The sense margin, as shown in FIG. 2a between the curves 24 and 26 is the margin separating the two states. Obviously, the wider this margin, the more reliable the data because less errors arise.

Figure 2B:
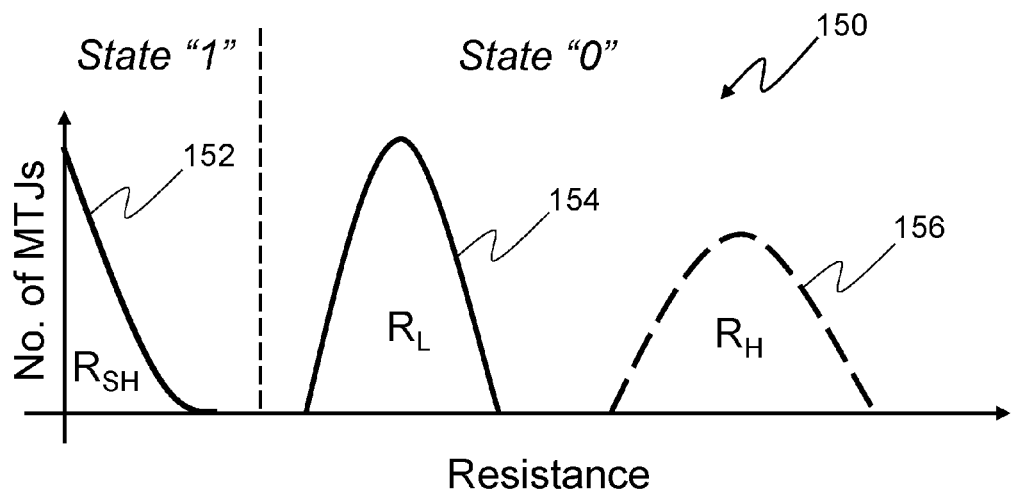
Figure 2C:
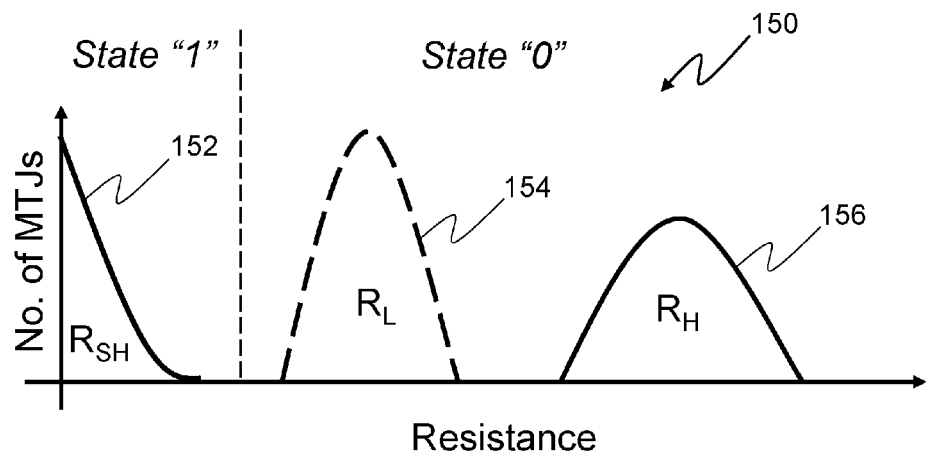

FIGS. 2b and 2c show graphs of resistance distribution curves representing the two logical states created from the three available resistance states discussed above. In both figures, graph 150 includes three curves, curve 152 representing the shorted resistance state $R_{SH}$, curve 154 representing the $R_L$ state, and curve 156 representing the $R_H$ state. The two logical states in FIG. 2b are shown by the curves 152 and 154, where curve 152 represents a (logic) state of "1" and curve 154 shows a (logic) state of "0". Curve 156 is not used in FIG. 2b, whereas, in FIG. 2c, curve 154 is not used and curves 152 and 156 represent two logic states, i.e. curve 152 represents the (logic) state "1" and curve 154 represents the (logic) state "0".

In summary, an MTJ may be intentionally shorted to represent one of two logical states by being subjected to a voltage greater than the breakdown voltage. Once the MTJ is shorted, its resistance becomes fixed and may be much lower than $R_L$. The other logical state is represented by a switchable high-resistance state or a switchable low-resistant state.

Referring back to FIG. 2c, in the case where $R_H$ (curve 156) is used to represent one of the two logical states, the distance between the $R_H$ and $R_{SH}$ is wider than the case where $R_L$ and $R_{SH}$ are used. The inventors have taken advantage of the wider gap in an alternative embodiment and method of the invention, as shown in FIG. 2d.

Figure 2D:
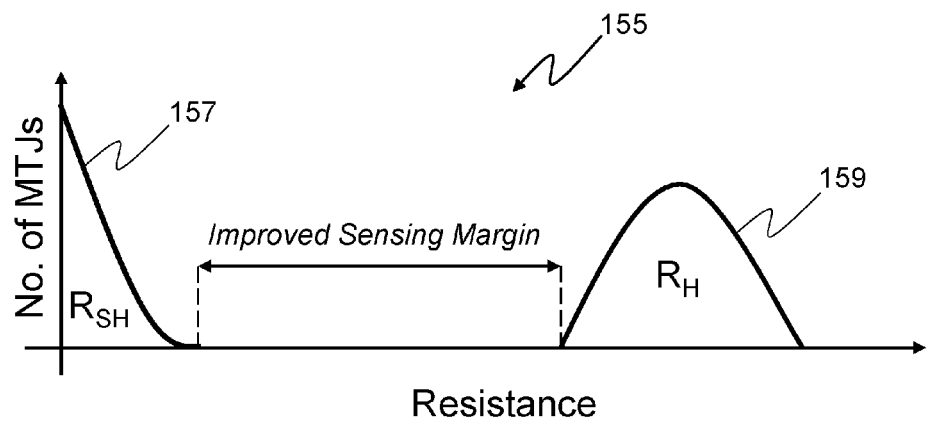

FIG. 2d shows the graph 155 to include curves 157 and 159. Curve 157 for the shorted resistance state represents one of the two logical states and curve 159 for the high resistance state represents the other logical state. The inventors have realized that if all of the switchable non-volatile memory cells of the selected portion of the memory device are set to the high resistance state $R_H$ represented by curve 159 after exposure to high temperatures, a wider sense margin between the shorted resistance state and the high resistance state reduces the probability of sensing errors and thereby improves reliability. It is noted that the $R_H$ state is used instead of the $R_L$ state because of $R_H$'s wider sense margin characteristic relative to the shorted resistance state discussed below.

After exposure to high temperatures that cause the switchable memory cells in the selected portion of the memory device to be in the high and low resistance states, programming all of the switchable memory cells to the high resistance state represented by curve 159 ($R_H$) improves the sense margin, thereby improving the reliability of sensing operations of the selected portion of the memory device as shown in FIG. 2d. Since the selected portion of the memory device relies on permanently shorting of some of the memory cells therein, the selected portion effectively becomes one-time-programmable (OTP) memory. Accordingly, the non-volatile memory device of the present invention has a switchable portion that can be repeatedly programmed and an OTP portion that can withstand high temperatures but can only be programmed once. In embodiments where the non-volatile memory cells are made of MTJs, the resistance state of the switchable MTJs may be switched to $R_H$ by passing switching currents directly through the MTJs to generate spin-transfer torque to switch the magnetization thereof. Alternatively, the resistance state of the switchable MTJs may be switched to $R_H$ by applying an external magnetic field to the memory device to switch the magnetization of the MTJs.

The memory device may have any suitable non-volatile memory cell configuration. In exemplary embodiments, reference MTJs or differential MTJs are employed in designing the memory device. As earlier noted, by shorting the MTJ, a third fixed resistance state may be introduced for storing data. This fixed resistance state is guaranteed to remain fixed after packaging and solder reflow but obviously cannot be reprogrammed because the MTJ is no longer capable of switching its resistance state. In this manner, the selected portion of the memory device utilizing the shorted resistance state effectively becomes OTP memory block(s).

In an alternative embodiment and method of the invention, the OTP memory blocks are replaced with non-OTP memory blocks when data stored in the OTP memory blocks is intended to be rewritten or updated. Updating or rewriting of data stored in the OTP memory blocks may be initiated in various manners, one of which is a user command and another is by a signal. Therefore, the rewriting of data stored in the OTP memory blocks can be done by using non-OTP memory blocks after exposure to high temperatures. An example of the foregoing is illustrated in FIG. 3.

For the purpose of further clarification, prior to exposure of high temperatures, the switchable cells in the OTP memory blocks may be programmed to either $R_H$ or $R_L$. In an alternative embodiment, the switchable cells are programmed to $R_H$ to improve the sense margin after exposure of high temperatures, as further discussed below. However, the latter programming to $R_H$ is optional.

Figure 3:
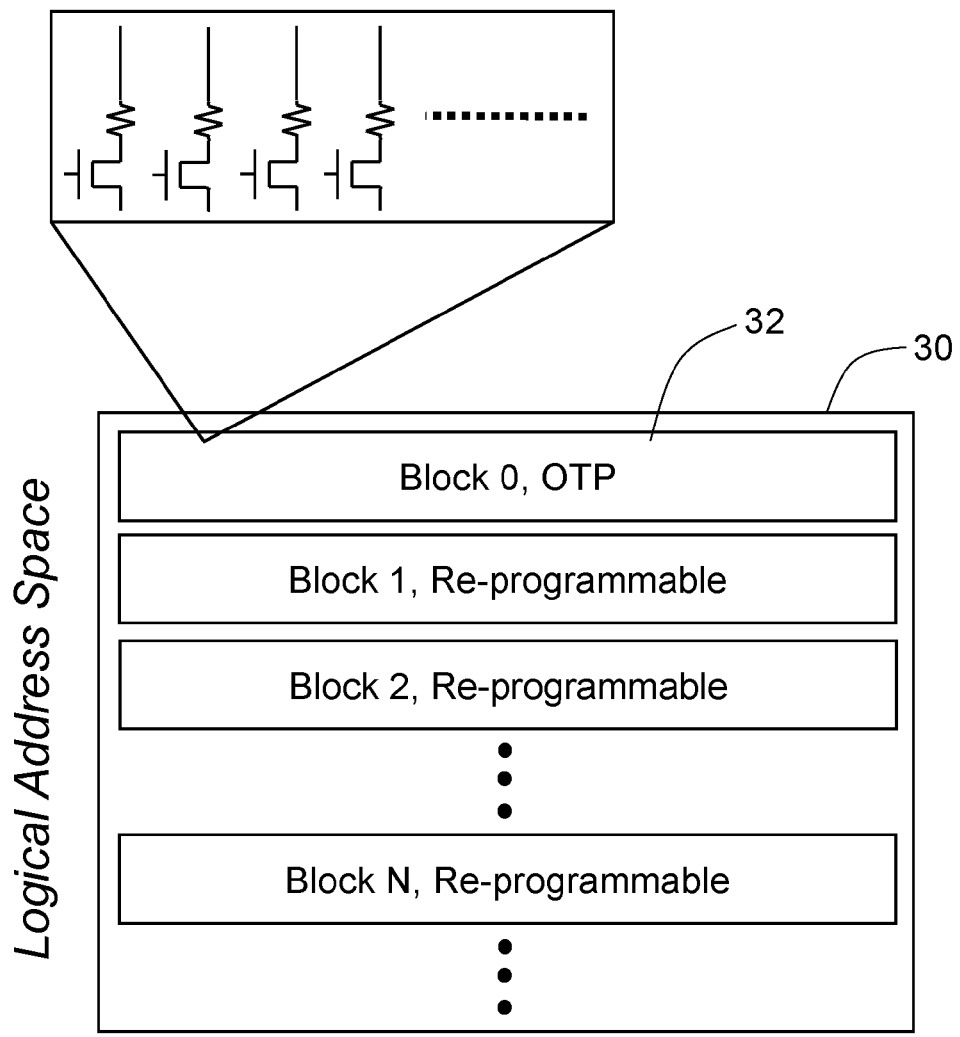
FIG. 3 shows an exemplary memory device 30 including Blocks 0-N after sorting of a wafer onto which the memory device is formed.

FIG. 3 shows an exemplary memory device 30 having memory Blocks 0-N before exposure to high temperatures, such as after the process of sorting a wafer or testing individual memory devices on the wafer. "N" represents an integer value. Blocks 0-N can be considered as a portion of the memory device 30, a part of which is designated as OTP memory. As shown in the exploded view, each of Blocks 0-N is made of a number of non-volatile memory cells, such as MTJs among a list of various types non-volatile memory as discussed above. The exploded view of Block 0 in FIG. 3 is shown to include a number of MTJs, displayed with resistor symbols, coupled to a transistor. The transistor is an access transistor used for accessing the corresponding MTJ during read and write operations. In some embodiments, the access transistor may be replaced by a bi-directional two-terminal selector device, such as Ovonic threshold switch (OTS) or the like.

Blocks 0-N are in a space within the memory device that is addressed by logical addresses. The logical address space occupying Blocks 0-N is memory space addressed by logical addresses. At least a part of the logical address space may be used to save non-user data during manufacturing by a system employing the memory device. Non-user data includes, without limitation, firmware and applications in the forms of test code, boot code and applications useful to a user of the system.

Block 0, at 32, is shown to reside in a one-time-programmable (OTP) area in the memory device 30 and may be programmed during or after sorting of the wafer and before the memory device 30 experiences high temperatures associated with packaging or solder reflow process. Thus, once programmed by shorting some of the memory cells during manufacturing, Block 0 no longer becomes programmable. Blocks 1-N, on the other hand, remain reprogrammable and are not made of OTP memory. It is understood that more than one block may form the OTP memory space.

What makes Block 0, at 32, OTP memory is the shorting of one or more of its non-volatile memory cells. As earlier discussed, this creates a resistance state represented by shorted non-volatile memory cells (MTJs). Another resistance state remains represented by a range of relatively low resistances ($R_L$) of MTJs, and the last resistance state remains represented by a range of relatively high resistances ($R_H$) of MTJs.

The non-volatile memory cells of Block 0 are shorted by applying a voltage thereto that is high enough to permanently short the cells. Currently, an example of such a breakdown voltage is in the range of about 1 to 3 V for a time period of about 100 ms to 1 min. Shorting the cells results in reducing their resistance to be considerably lower than that of cells with a high resistance $R_H$, and indeed, even those with a low resistance, $R_L$. In some embodiments where the switchable MTJs in the OTP portion of the memory device are programmed to the high resistance state, a wider gap between $R_H$ and the shorted resistance $R_{SH}$ than the gap between $R_H$ and $R_L$ exists, as earlier discussed. A wider gap, in embodiments cited above, reduces the probability of sensing errors, thereby increasing reliability of the non-volatile memory device.

In an embodiment of the invention, the shorted resistance $R_{SH}$ represents one of the two logical states "1" and "0" while either $R_L$ or $R_H$ represents the other logical state. An example of the programming of Block 0 using $R_H$ and $R_{SH}$ is presented below.

Assuming a sequence of "10101010" bits of data scheduled to be programmed into Block 0, the shorted resistance $R_{SH}$ represents the logical state "1", and $R_H$ is selected to represent "0". In other words, the foregoing sequence results in the following sequence of resistances: "$R_{SH}R_HR_{SH}R_HR_{SH}R_HR_{SH}R_H$". The binary data "10101010" is permanently programmed into Block 0 after shorting some of the memory cells. Accordingly, elevated temperatures that would ordinarily cause unintentional random switching of the resistance state between $R_H$ and $R_L$ would not affect the resistance state of the shorted memory cells. Although the switchable memory cells might switch from $R_L$ to $R_H$ or vice versa, the data remains undisturbed due to the state assignment (for example state "1" being the shorted state and state "0" being the non-shorted state). Thus, high temperature manufacturing steps, such as packaging and solder reflow process, no longer present a risk to the integrity of previously stored data.

Figure 4:
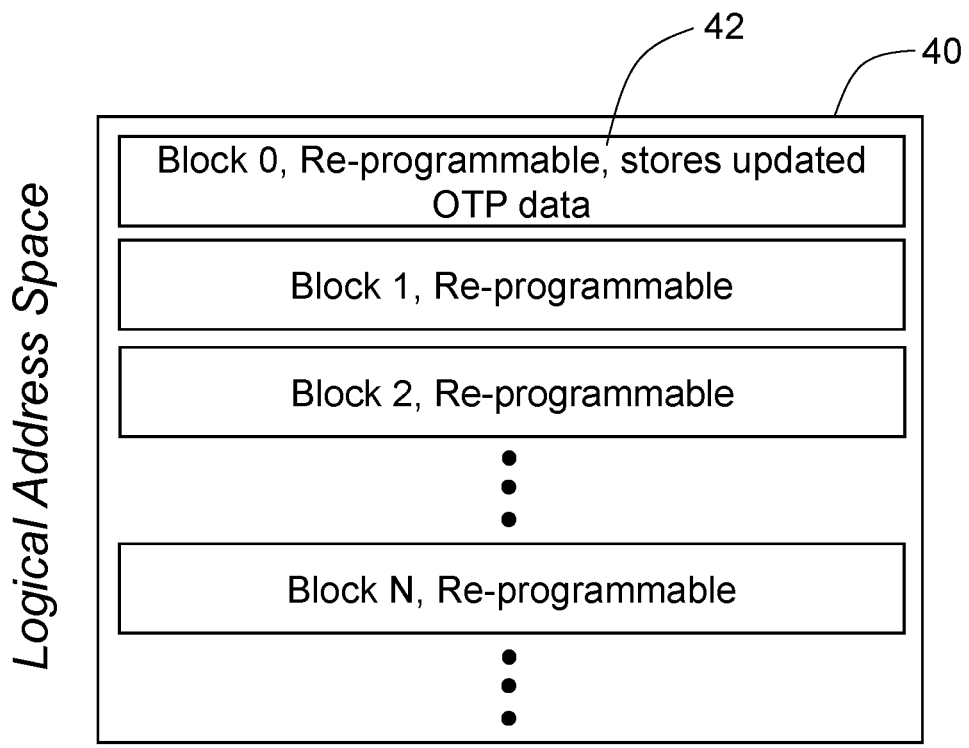
FIG. 4 shows an exemplary memory device 40 with Blocks 0-N, similar to those of FIG. 3, during reprogramming or updating of data stored in Block 0.

FIG. 4 shows an exemplary memory device 40 with Blocks 0-N, similar to those of FIG. 3, after manufacturing and during reprogramming or updating of the data stored in Blocks 0-N. A host or system that is in communication with the memory device 40 may want to update the data stored in the OTP memory portion of the memory device 40. An example of the manner in which the system would initiate reprogramming is by issuing a command or sending a signal or any other suitable manner. Alternatively, the memory device itself may realize when Blocks 0-N are to be reprogrammed based on their unique addresses since the memory blocks are typically assigned predetermined addresses. Clearly, Block 0, which functions like an OTP memory, cannot be physically reprogrammed because some of its memory cells are in the shorted resistance state. In this case, after manufacturing and in accordance with a method and apparatus of the invention, data intended for Block 0 shown at 32 in FIG. 3 is redirected to a non-OTP part 42 of the memory device 40 located externally to the OTP memory portion as shown in FIG. 4. The data is then programmed (or written) into the non-OTP memory area 42 and accordingly can be reprogrammed (or updated) even more than once. All the meanwhile, the host remains ignorant of the new physical location of Block 0 and indeed has no reason to know the redirection.

Practically speaking, the host may send data to be saved in a sequence of addresses pointing to Block 0. Upon the receipt of these addresses, the memory device realizes that the data is meant for Block 0, which is in the OTP memory portion, and therefore redirects the data to be saved to a sequence of addresses pointing to non-OTP memory locations, i.e. a shadow (or virtual) Block 0.

Figure 5:
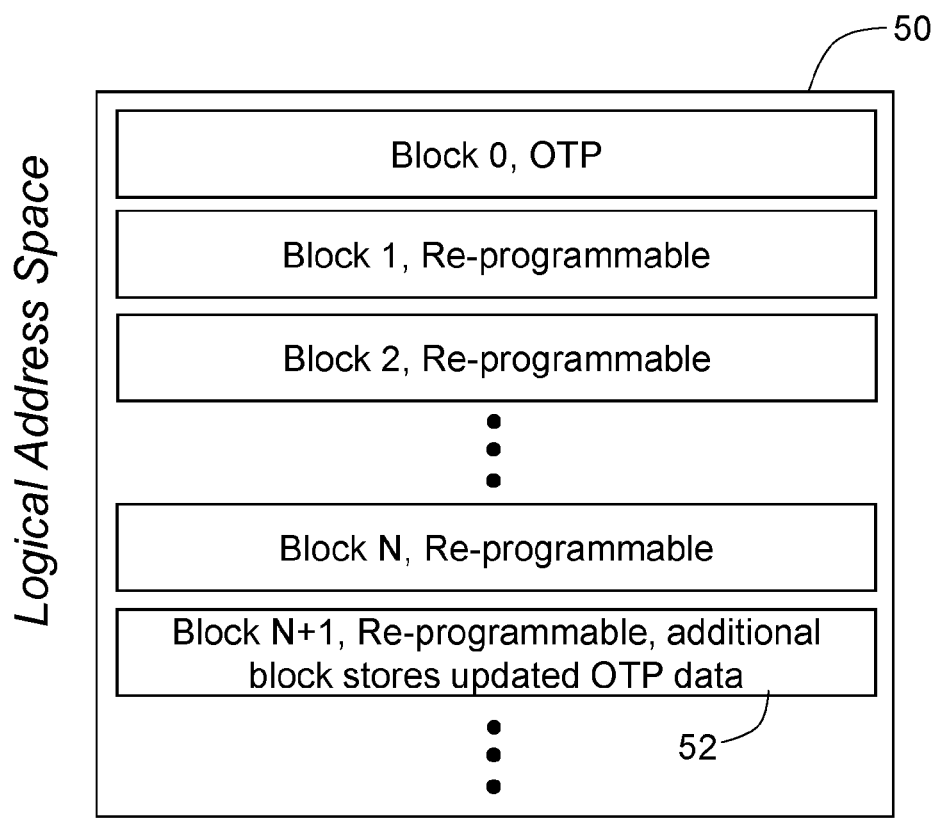
FIG. 5 shows an alternative method and apparatus for reprogramming and/or updating data stored in OTP Block 0.

FIG. 5 shows an alternative method and apparatus for reprogramming and/or updating the data stored in the OTP Block 0. In FIG. 5, the memory device 50 is shown to include Blocks 0-N, as shown in FIGS. 3 and 4 and additionally has an extra block, shown at 52, i.e. Block N+1. Block N+1 is in an extension location within the reprogrammable portion of the memory device 50 defined by Blocks 1-N. In FIG. 5, a user (or host) of the memory device 50 can take control of the location into which reprogrammed or updated data is to be stored. This would obviously require the user to be aware of the location of the OTP memory cells or at least know not to address those cells for reprogramming.

Figure 6:
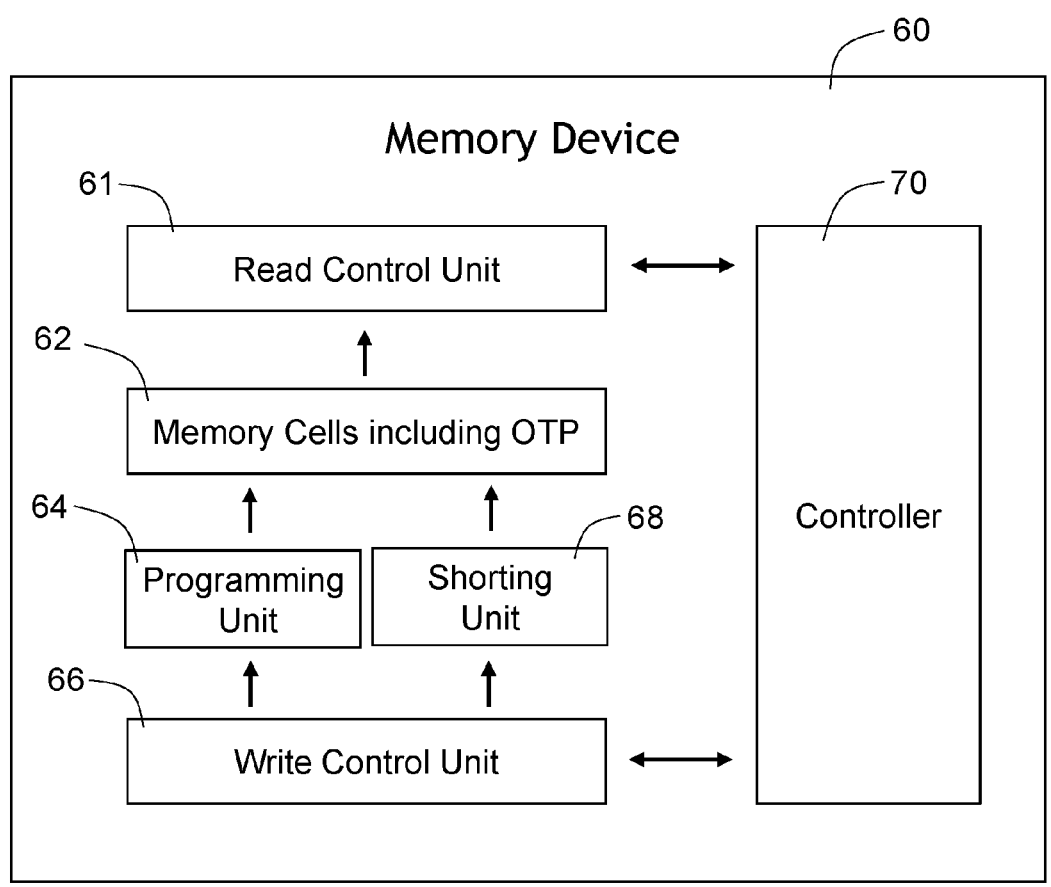
FIG. 6 shows a high-level block diagram of some of the relevant structures of the memory device 60 in accordance with an embodiment of the invention.

FIG. 6 shows a high level block diagram of some of the relevant structures of a memory device 60 in accordance with an embodiment of the invention. The memory device 60 is analogous to the memory devices 30/40/50 shown and discussed with respect to previous figures. In the embodiment of FIG. 6, the memory device 60 is shown to include a plurality of non-volatile memory cells 62 including therein an OTP portion, analogous to the blocks shown and described relative to FIGS. 3-5. The memory device 60 is further shown to include a read control unit 61, a programming unit 64, a write control unit 66, a shorting unit 68, and a controller 70. Alternatively, the controller 70 may be located externally to the memory device 60. In fact, most of the remaining structures, such as the programming unit 64, the write control unit 66, the shorting unit 68, and the read control unit 61, may be located externally to the memory device 60.

The controller 70 masterminds arbitration between the units 61, 64, 66 and 68 and the OTP portion of the non-volatile memory cells 62. Alternatively, the programming unit 64, the shorting unit 68, the write control unit 66, and the read control unit 61 may be directly coupled to the OTP portion of the non-volatile memory cells 62.

The programming unit 64 writes non-user data to the OTP portion of the non-volatile memory cells 62, generally during the manufacturing process. The write control unit 66 initiates shorting of the memory cells in the OTP portion of the non-volatile memory cells 62. The shorting unit 68 receives instruction from the write control unit 66 as to which bits should be shorted and performs the shorting process on the selected bits in the OTP portion. As previously noted, the shorting unit 68, in an embodiment and method of the invention, applies or causes to apply a voltage sufficiently high to permanently short the MTJs in the OTP portion. The read control unit 61 reads (or senses) data, under the control of the controller 70, from the OTP portion and provides the data to another structure or the user.

Initiation of shorting is done by either a command or a signal, by address identification or any other type of suitable mechanism by a host located externally to the memory device 60 or alternatively by the controller 70.

Figure 7:
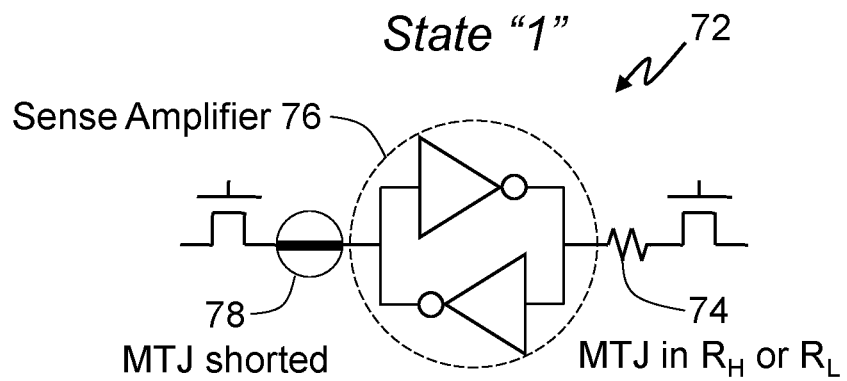
FIGS. 7-12 show various configurations and states of MTJ cells employed with embodiments and methods of the present invention.
Figure 8:
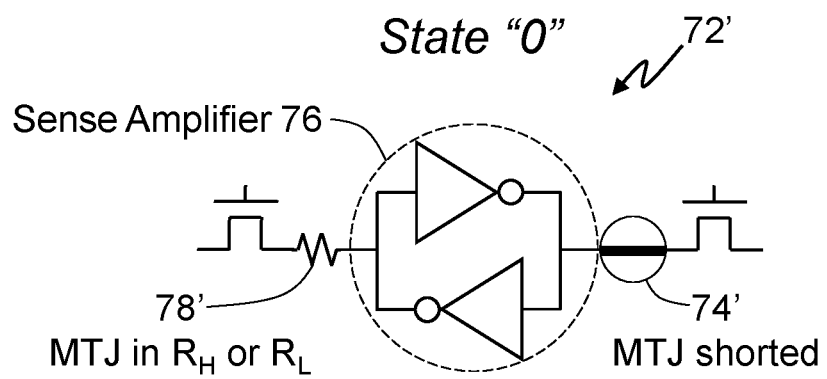

FIGS. 7-12 show various configurations and states of the MTJ memory cells employed in the OTP portion of the memory device 60. FIG. 7 illustrates a memory configuration 72 in which two MTJs 74 and 78 with different resistance states are used together to store one bit of data "1" according to a differential sensing scheme, while FIG. 8 shows another memory configuration 72' in which the two MTJs 74' and 78' together stores one bit of data "0". The choice of "1" and "0" is merely a design choice and may be reversed. Both memory configurations 72 and 72' are designed using a differential scheme readily known to those in the art. Briefly, the memory configuration 72 includes two MTJs 78 and 74, each of which coupled to a respective access transistor, being coupled to a sense amplifier 76. Alternatively, the access transistor may be replaced by a bi-directional two-terminal selector device, such as Ovonic threshold switch (OTS) or the like. The sense amplifier 76 is shown coupled to both MTJs 78 and 74 and senses a higher resistance state ($R_H$ or $R_L$) at one of its two ends that is coupled to the MTJ 74 and senses the lowest resistance state ($R_{SH}$) at the other end coupled to the MTJ 78.

It is noted that the memory configuration 72 is a part of a non-volatile memory array, generally located in the memory device of the various embodiments of the invention, such as, without limitation, Blocks 0-N.

In FIG. 7, the MTJ 78 is shown shorted while the MTJ 74 is shown to have the resistance state of either $R_L$ or $R_H$. The difference in resistance between the two MTJs 74 and 78 determines the logical state of "1" represented by the memory configuration 72. The memory configuration 72' in FIG. 8 represents the logical state of '0" with the MTJ 74' being shorted and the MTJ 78' having the resistance state of either $R_L$ or $R_H$. The choice of "1" and "0" for the memory configurations 72 and 72', respectively, is merely a design choice and may be reversed.

Figure 9:
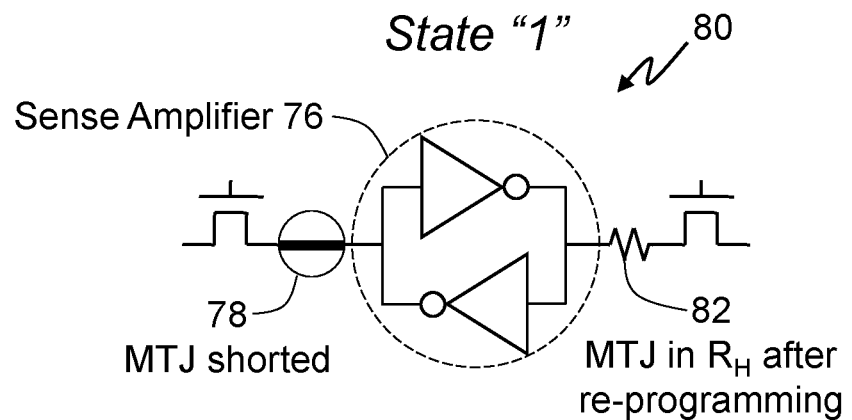
Figure 10:
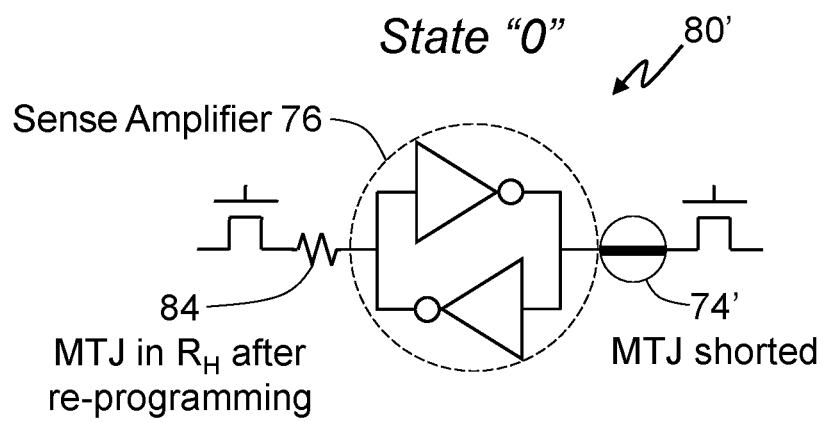

To further improve the sense margin for the OTP portion of the memory device, the switchable MTJs in the OTP portion may be reprogrammed to $R_H$ after exposure to high temperatures as discussed earlier. FIGS. 9 and 10 show the MTJ 82 in FIG. 9 and the MTJ 84 in FIG. 10 may be reprogrammed to $R_H$ if not already in $R_H$. As discussed earlier, the reprogramming of an MTJ may be done by flowing a current directly through the MTJ itself to generate a spin transfer torque that switches the magnetization direction of the magnetic free layer. Alternatively, all switchable MTJs in the OTP portion may be simultaneously switched by applying an external magnetic field to the memory device.

Figure 11:
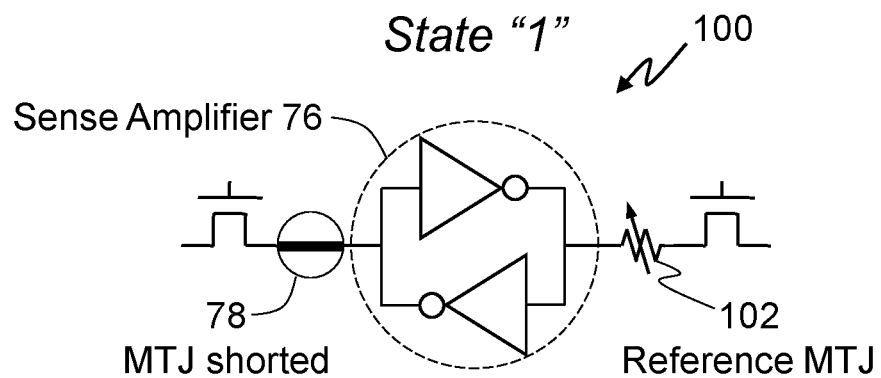
Figure 12:
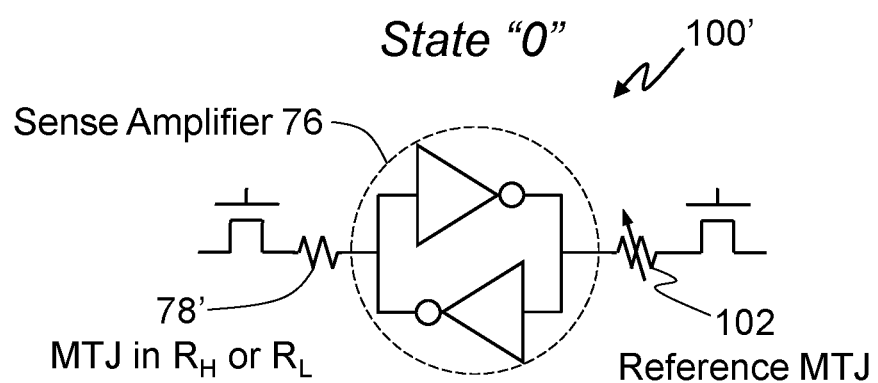

FIGS. 11 and 12 are analogous to FIGS. 7 and 8, respectively, except that different configurations 100 and 100' of MTJs are employed in accordance with a different sensing scheme. In the memory configurations 100 and 100' of FIGS. 11 and 12, respectively, a reference MTJ 102 is used in place of MTJs 74 and 74' in FIGS. 7 and 8, respectively. In contrast to the memory configuration 72 of FIG. 7 that uses two MTJs 74 and 78 to store one bit of data, the memory configuration 100 of FIG. 11 uses only the MTJ 78 to store one bit of data. The logical state represented by the MTJ 78 is determined by comparing the difference in resistance between the MTJ 78 and the reference MTJ 102. Unlike the MTJ 74 in FIG. 7, the reference MTJ 102 may serve as reference to multiple MTJs that store data. For example, an array of MTJs that store data may use the same reference MTJ, the resistance of which may be adjusted by manipulating its resistance state and the sensing current. Therefore, the reference MTJ 102 effectively behaves like a variable resistor. To further improve the reliability and accuracy of the reference MTJ 102, multiple reference MTJs may be used together instead to provide an averaged resistance as reference. The shorted MTJ 78 in FIG. 11 and the MTJ 78' in either the $R_L$ or $R_H$ state in FIG. 12 represent the logical states "1" and "0," respectively. The choice of "1" and "0" for the memory configurations 100 and 100', respectively, is merely a design choice and may be reversed.

The sense margin of the memory configuration 100' shown in FIG. 12 may be further improved by reprogramming the resistance state of the MTJ 78' to $R_H$ after exposure to high temperatures, thereby providing a maximum contrast to the shorted resistance state.

It is understood that while two memory configurations of MTJ cells are shown and discussed in FIGS. 7-12 with respect to two different sensing schemes, other configurations generally known to those in the art are contemplated.

Figure 13:
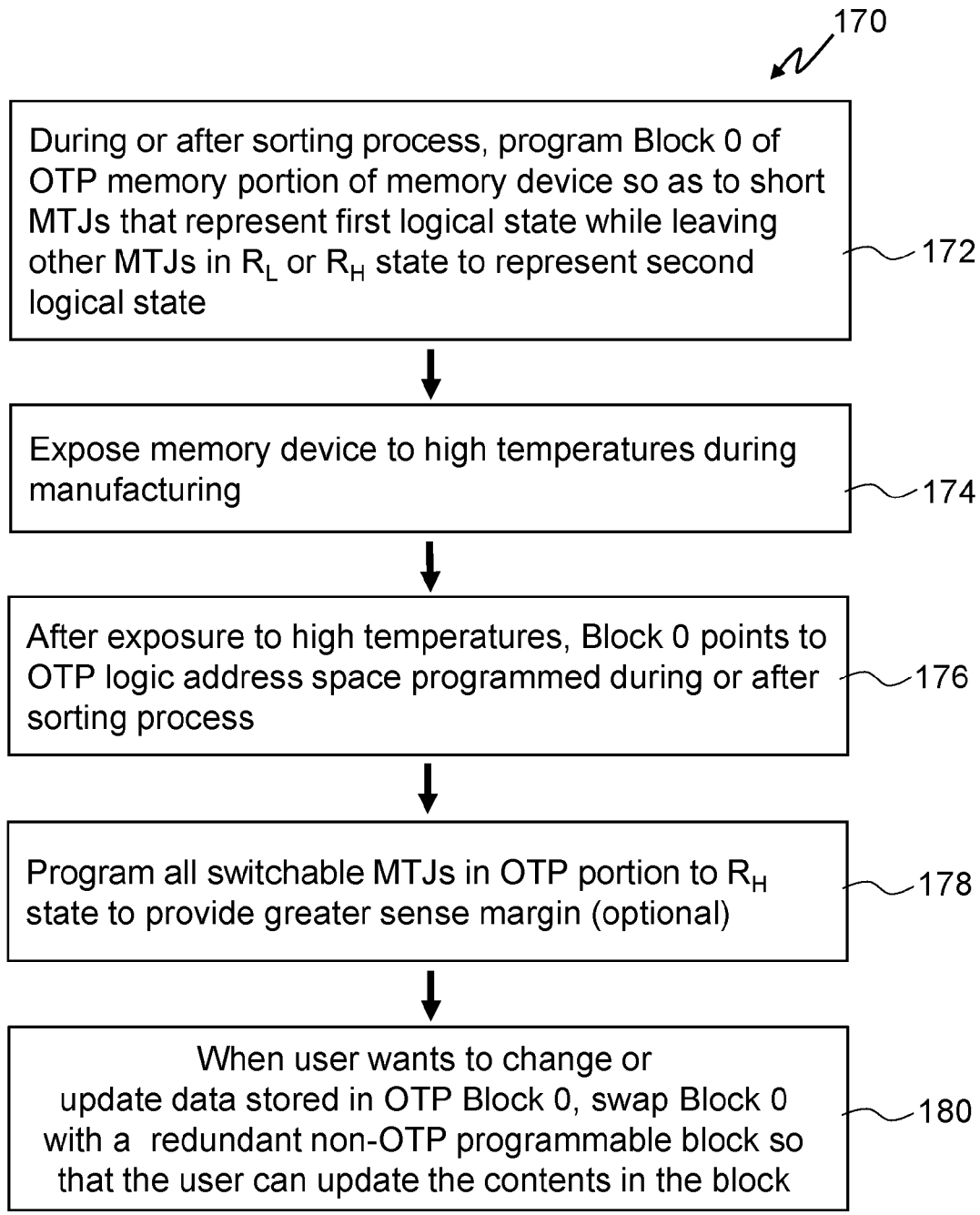
FIG. 13 shows a flow chart 170 of selected steps performed by the memory device 60 shown in FIG. 6 when programming and reprogramming Block 0 in accordance with methods of the invention.

FIG. 13 shows a flow chart 170 of selected steps performed by the memory device 60 of FIG. 6 during programming of the OTP portion thereof (i.e. Block 0) in accordance with a method of the invention. At step 172, during or after sorting process at manufacturing, during which individual memory devices are tested and checked on a wafer before dicing, Block 0 in the OTP portion of the memory cells 62 (of FIG. 6) is programmed by permanently shorting some of the MTJs that are to take on a first logical state and while other switchable MTJs in the OTP portion are left in either the $R_H$ or $R_L$ to represent a second logical state, opposite to the first logical state. In an embodiment, the first and second logical states are "0" and "1," respectively. In another embodiment, the first and second logical states are "1" and "0," respectively. The data being saved during or after the sorting process may be provided by the manufacturer and may be non-user data. The switchable MTJs in the OTP portion may optionally be programmed to a desired resistance state $R_H$ or $R_L$. In an embodiment, the memory device 60 is an STT-MRAM including a plurality of MTJs with the magnetic free layer of each MTJ having a variable magnetization direction that is substantially perpendicular to the layer plane thereof.

Next, at step 174, the memory device 60, including the OTP portion, are exposed to high temperature processes, such as die packaging and solder reflow. The temperatures experienced in these manufacturing processes are sufficiently high to cause the unintended switching or random switching of the resistance state of at least one MTJ in the memory device 60. In an embodiment, the memory device 60 is exposed to a maximum process temperature between about 100 and about 400° C. In another embodiment, the maximum process temperature is between about 150 and about 350° C. In still another embodiment, the maximum process temperature is between about 200 and about 300° C.

Next, at step 176, after exposing the memory device 60 to high temperatures, Block 0 points to the OTP logic address space programmed during or after the sorting process. Optionally, at step 178, all switchable MTJs in the OTP portion of the memory device 60 are programmed to the $R_H$ state, thereby providing a larger sense margin.

At step 180, when the user wishes to update the data stored in the OTP portion (i.e. Block 0) after manufacturing, the contents of Block 0 is swapped (saved) to another block of the memory device in a non-OTP location in which MTJs are reprogrammable. Thus, the non-OTP block is a redundant block containing therein switchable MTJs and allows the user to update the contents of Block 0 without necessarily being aware of the actual physical memory space in which the contents of Block 0 are kept. In other words, Block 0 is replaced with a shadow (or redundant) and reprogrammable block, such as Blocks 1-N, allowing the user the capability to successfully update the contents of the Block 0. As a practical matter, in accordance with an embodiment of the invention, the controller 70 of FIG. 6 re-routes updates to Block 0 to a reprogrammable block memory location, which may remain invisible to the user. Alternatively, the user may choose to update the data stored in Block 0 at a specified memory location. In which case the user needs to be aware of the re-direction. While Block 0 is used in the above example, it is understood that the embodiments and methods of the invention apply to any block(s) or memory locations of the memory device 60.

Figure 14:
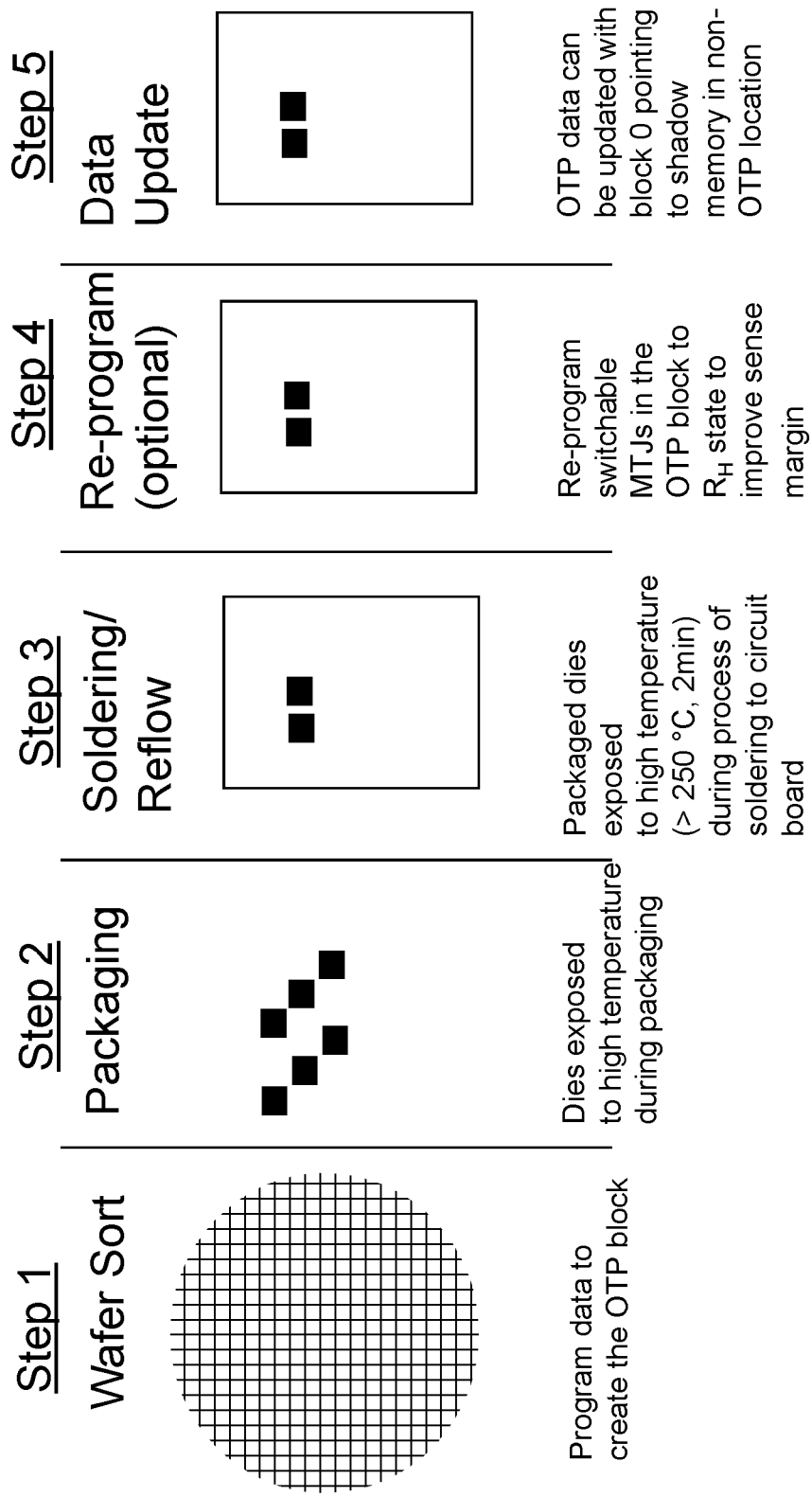
FIG. 14 illustrates process steps a die experiences from the time it is a part of a wafer through programming, packaging, and reprogramming of its OTP memory portion in accordance with methods of the present invention.

FIG. 14 illustrates the selected process steps a die experiences from the time it is a part of a wafer through programming, packaging, and reprogramming of its OTP memory in accordance with methods of the invention. At Step 1, at a time when the die is a part of the wafer onto which it is formed, the die (in fact all dies) is programmed with data in a memory space designated by a manufacture or user as OTP memory space. Next, at Step 2, the die is diced and packaged during which time the die may be exposed to a temperature sufficiently high to cause random switching of the resistance state of at least one MTJ cell. For example, the die could reach a temperature of about 200° C. for several minutes during packaging. The die may experience further high-temperature process steps that could cause random switching of the resistance state of the MTJs, such as soldering of the packaged die onto a circuit board at Step 3, which may exposed the die to a temperature of about 250° C. for a period of about 2 min. The integrity of the stored data in the OTP memory portion of the die remains intact despite exposure to high temperatures at Steps 2 and 3. Next, at the optional Step 4, the switchable MTJs in the OTP memory portion may be reprogrammed to the $R_H$ state to further improve the sense margin. At Step 5, the data in the OTP memory portion may be updated by shadowing the OTP data location with a non-OTP data location.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, ¶6.

What is claimed:

1. A method for using a non-volatile memory including a plurality of magnetic tunnel junctions (MTJs) for data storage, the method comprising the steps of:
   shorting a portion of the plurality of MTJs by applying a breakdown voltage thereto, the portion of the plurality of MTJs having fixed resistance and representing a first logical state, the remaining portion of the plurality of MTJs having variable resistance and representing a second logical state; and
   heating the plurality of MTJs to a temperature sufficiently high to cause at least one of the remaining portion of the plurality of MTJs to change the variable resistance thereof,
   wherein the variable resistance of the remaining portion of the plurality of MTJs is switchable between a low resistance level and a high resistance level.

2. The method of claim 1, wherein the temperature is between about 150° C. and about 350° C.

3. The method of claim 1, wherein the temperature is between about 200° C. and about 300° C.

4. The method of claim 1, wherein the non-volatile memory is spin-transfer torque magnetic random access memory (STT-MRAM).

5. The method of claim 1, wherein each of the plurality of MTJs includes a magnetic free layer having a magnetization direction substantially perpendicular to a layer plane thereof and a magnetic reference layer having a fixed magnetization direction substantially perpendicular to a layer plane thereof.

6. The method of claim 1, wherein each of the plurality of MTJs is coupled to a two-terminal selector device in series.

7. The method of claim 1, wherein the step of shorting a portion of the plurality of MTJs is carried out while the non-volatile memory is a part of a wafer before being diced.

8. The method of claim 1 further comprising the step of programming the remaining portion of the plurality of MTJs that represents the second logical state to the high resistance level after the step of heating.

9. The method of claim 8, wherein the step of programming the remaining portion of the plurality of MTJs is carried by out by exposing the non-volatile memory to an external magnetic field.

10. The method of claim 1 further comprising the step of transferring all data stored in the plurality of MTJs after the step of heating to another plurality of MTJs in the non-volatile memory, each of the another plurality of MTJs having variable resistance that is switchable between a low resistance level and a high resistance level.

11. The method of claim 10, wherein the another plurality of MTJs replace the plurality of MTJs in the non-volatile memory device and have the same logical addresses as the plurality of MTJs.

12. The method of claim 10, wherein the low and high resistance levels of the another plurality of MTJs represent the first and second logical states, respectively.

13. The method of claim 10, wherein the low and high resistance levels of the another plurality of MTJs represent the second and first logical states, respectively.

* * * * *